US011557491B2

(12) United States Patent
van Gemert et al.

(10) Patent No.: US 11,557,491 B2
(45) Date of Patent: Jan. 17, 2023

(54) SELECTIVE UNDERFILL ASSEMBLY AND METHOD THEREFOR

(71) Applicant: NXP B.V., Eindhoven (NL)

(72) Inventors: Leo van Gemert, Nijmegen (NL); Peter Joseph Hubert Drummen, Someren (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/669,579

(22) Filed: Oct. 31, 2019

(65) Prior Publication Data
US 2021/0134612 A1    May 6, 2021

(51) Int. Cl.
| H01L 23/552 | (2006.01) |
| H01L 21/56 | (2006.01) |
| H01L 23/00 | (2006.01) |
| H01L 23/31 | (2006.01) |
| H01L 21/48 | (2006.01) |
| H01L 23/66 | (2006.01) |

(52) U.S. Cl.
CPC ........ *H01L 21/563* (2013.01); *H01L 21/4853* (2013.01); *H01L 23/3157* (2013.01); *H01L 23/552* (2013.01); *H01L 23/66* (2013.01); *H01L 24/16* (2013.01); *H01L 24/81* (2013.01); *H01L 2224/16157* (2013.01); *H01L 2224/81815* (2013.01); *H01L 2924/18161* (2013.01); *H01L 2924/3025* (2013.01)

(58) Field of Classification Search
CPC ............... H01L 21/563; H01L 21/4853; H01L 2924/3025; H01L 2224/16157
See application file for complete search history.

(56) References Cited

U.S. PATENT DOCUMENTS

| 5,969,461 | A | 10/1999 | Anderson et al. |
| 6,800,946 | B2 | 10/2004 | Chason et al. |
| 8,169,060 | B2 | 5/2012 | Maurer et al. |
| 8,507,376 | B2 | 8/2013 | Ewert et al. |
| 8,796,075 | B2 * | 8/2014 | Babiarz ................ H01L 21/324 438/118 |
| 8,860,212 | B1 | 10/2014 | Foong et al. |
| 9,136,230 | B2 | 9/2015 | Demin et al. |
| 9,627,346 | B2 * | 4/2017 | Hsu ......................... H01L 24/32 |
| 9,679,881 | B2 * | 6/2017 | Pagaila ............... H01L 25/0657 |
| 2002/0060368 | A1 * | 5/2002 | Jiang ....................... H01L 24/32 257/778 |
| 2004/0103509 | A1 | 6/2004 | Bidard et al. |
| 2004/0118599 | A1 | 6/2004 | Chason |

(Continued)

OTHER PUBLICATIONS

U.S. Appl. No. 17/726,426, filed Apr. 21, 2022, entitled "Efficient Wave Guide Transition Between Package and PCB Using Solder Wall" (82295438US01).

*Primary Examiner* — Dale E Page
*Assistant Examiner* — Wilner Jean Baptiste

(57) ABSTRACT

A method of forming an assembly is provided. The method includes attaching a packaged semiconductor device to a substrate. An isolation structure is formed and located between the packaged semiconductor device and the substrate. An underfill material is dispensed between the packaged semiconductor device and the substrate. The isolation structure prevents the underfill material from contacting a first conductive connection formed between the packaged semiconductor device and the substrate.

16 Claims, 10 Drawing Sheets

(56) References Cited

U.S. PATENT DOCUMENTS

| | | | |
|---|---|---|---|
| 2004/0195701 A1* | 10/2004 | Attarwala | H01L 21/4846 |
| | | | 257/783 |
| 2011/0147925 A1 | 6/2011 | Van Kempen et al. | |
| 2015/0321907 A1 | 11/2015 | Bowles et al. | |
| 2015/0364830 A1 | 12/2015 | Tong et al. | |
| 2017/0069605 A1* | 3/2017 | Yew | H01L 21/4853 |
| 2017/0228529 A1* | 8/2017 | Huang | H01L 24/20 |
| 2020/0343612 A1 | 10/2020 | Shi | |

* cited by examiner

SELECTIVE UNDERFILL ASSEMBLY AND METHOD THEREFOR

BACKGROUND

Field

This disclosure relates generally to semiconductor assembly, and more specifically, to selectively underfilling a semiconductor assembly.

Related Art

Today, there is an increasing trend to include sophisticated semiconductor devices in a variety of packaging types and form factors. Performance of many of these semiconductor devices can be negatively affected by the packaging type and/or form factor. For example, high frequency signals may be impacted by packaging impedances.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a selective underfilled assembly formed with a packaged semiconductor device mounted on a substrate. A group of conductive connectors are configured and arranged to form an isolation structure which separates an underfilled region from a non-underfilled region. The isolation structure serves as a dam or a barrier preventing the underfill material from reaching the non-underfilled region. Conductive connectors located within the non-underfilled region have reduced parasitic capacitances allowing for improved signal performance.

Figure 1:
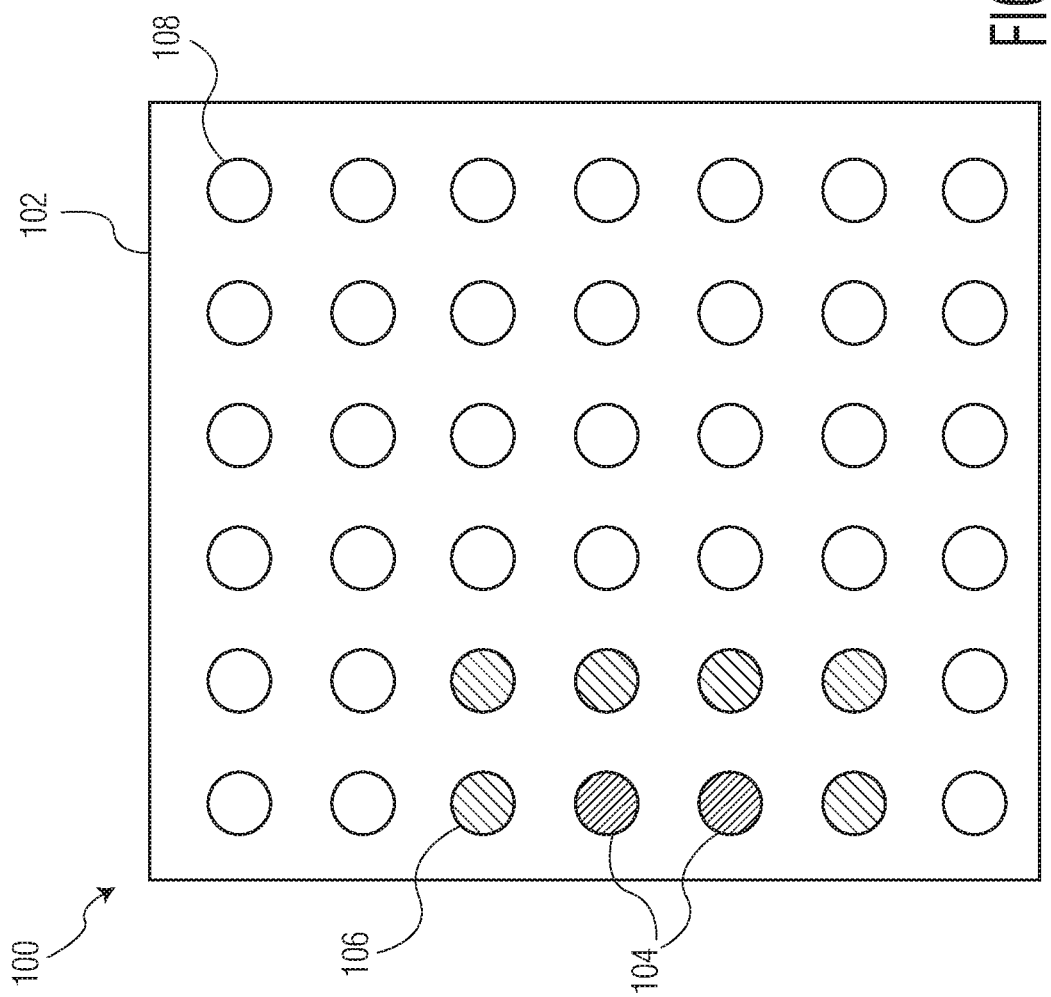
FIG. 1 illustrates, in a plan (through) view, an example packaged semiconductor device in accordance with an embodiment.

FIG. 1 illustrates, in a plan (through) view, an example packaged semiconductor device 100 in accordance with an embodiment. In this example, the packaged semiconductor device 100 may be characterized as a signal processing device configured for transmitting and/or receiving a signal (e.g., radio frequency, RF, signals). Packaged semiconductor device 100 includes an encapsulant 102 and a plurality of pins 104-108 (e.g., as viewed through the encapsulant 102). Aspects of the packaged semiconductor device 100 such as a semiconductor die, package substrate, and other features are not shown.

Packaged semiconductor device 100 is depicted with an orthogonal matrix arrangement of external pins (e.g., arranged in rows and columns) such as ball grid array (BGA) packaging, chip scale packaging (CSP), and the like. Here, pins 104-108 are connected to package pads (not shown) for connection to circuitry of the packaged semiconductor device 100. Pins 104-108 may be formed as any suitable conductive connection structure such as solder balls, gold studs, copper pillars, and the like, to electrically connect conductive features of packaged semiconductor device 100 with a substrate or printed circuit board (PCB), for example. In this embodiment, pins 104 are connected to input/output (I/O) circuits such as transceiver circuits configured for transmitting and/or receiving radio frequency (RF) signals. Pins 106 are configured and arranged to isolate and shield pins 104 from pins 108 and may be connected to a voltage supply terminal (e.g., ground). Pins 108 may be characterized as general-purpose pins such as address, data, clocks, reset, and control signal pins, along with other voltage supply pins.

Figure 2A:
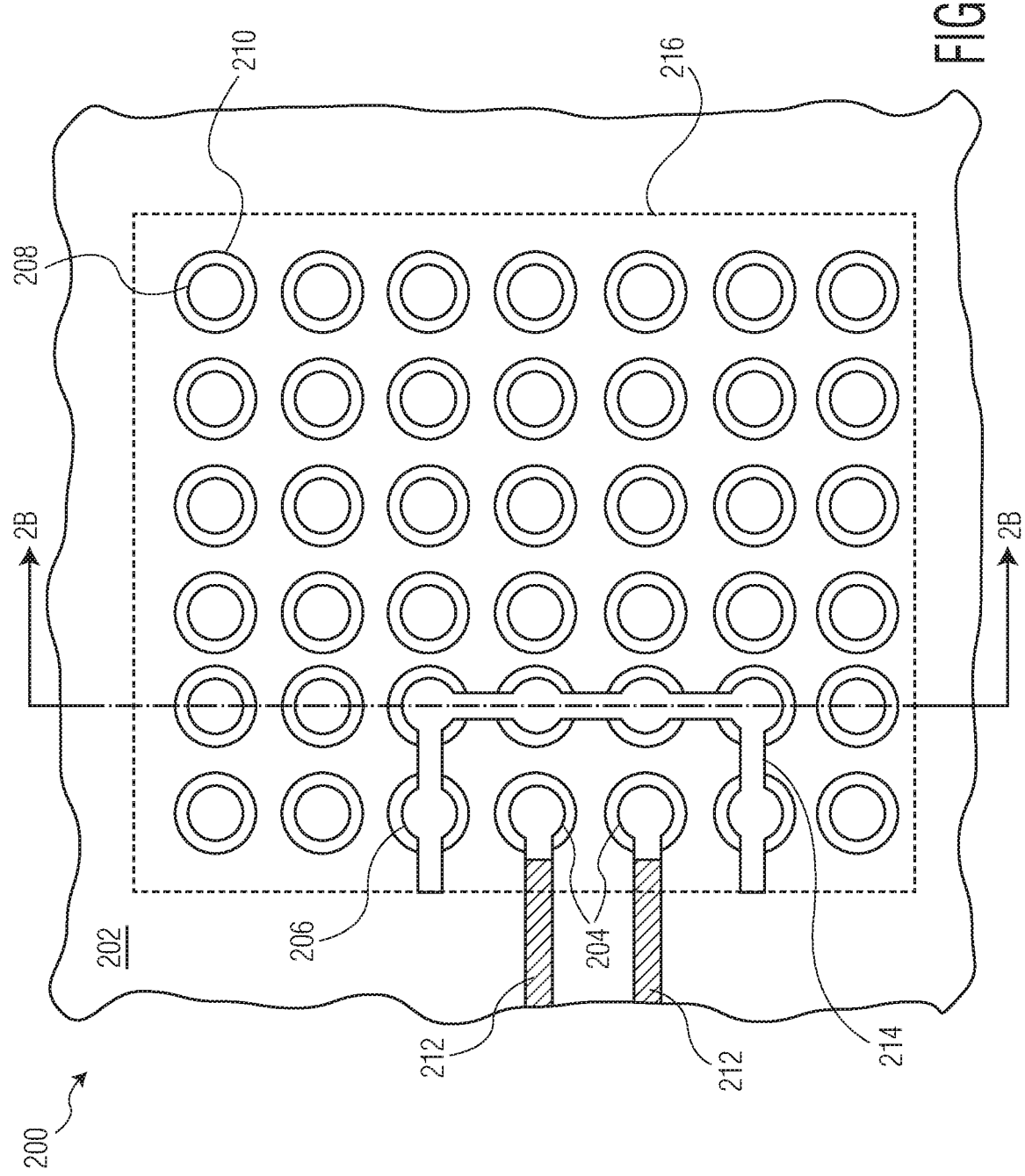
FIG. 2A illustrates, in a plan view, an example assembly including packaged semiconductor device and substrate in accordance with an embodiment.
Figure 2B:
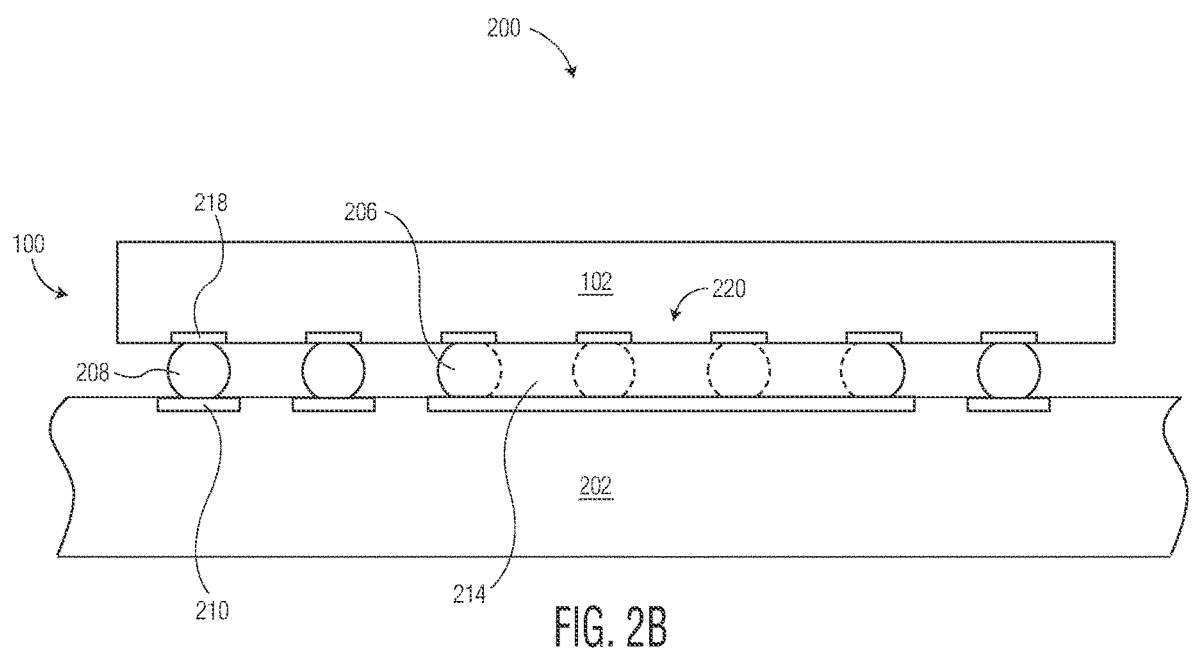
FIG. 2B illustrates, in a cross-sectional view, the example assembly including packaged semiconductor device and substrate in accordance with an embodiment.

FIG. 2A and FIG. 2B illustrate, in simplified plan and cross-sectional views, an example assembly 200 including packaged semiconductor device 100 and substrate 202 in accordance with an embodiment. In the plan view (FIG. 2A) of the example assembly 200, packaged semiconductor device 100 is depicted in a through view having a perimeter 216 indicated by a dashed line. The cross-sectional view (FIG. 2B) of the example assembly 200 is taken along line 2B-2B of FIG. 2A. At this stage of manufacture, packaged semiconductor device 100 is affixed to substrate 202.

Packaged semiconductor device 100 is shown in this example as BGA packaged device. In the cross-sectional view of FIG. 2B, the packaged semiconductor device 100 includes encapsulant 102 and package pads 218. Encapsulant 102 may be formed from any suitable epoxy molding compound and the like. Package pads 218 provide external connection to circuitry of the packaged semiconductor device 100.

Substrate 202 is formed from an insulating material and includes conductive pads 210 formed at the surface of substrate 202. In this embodiment, conductive pads 210 are orthogonally arranged in rows and columns. Substrate 202 may be characterized as a printed circuit board (PCB) having one or more layers of conductive interconnecting traces (not shown) separated by non-conductive material (e.g., FR-4). Conductive pads 210 may be formed from suitable conductive materials such as copper, gold, tin, and the like. A plurality of conductive connections are formed between conductive pads 210 and package pads 218 of the packaged semiconductor device 100 by way of a plurality of conductive connectors 204-208. Conductive connectors 204-208 (e.g., solder ball pins 104-108 after reflow) are affixed at pads 210 and 218 using techniques such as solder reflow and the like. Alternatively, conductive connectors 204-208 may be formed as any suitable conductive structure such as gold studs, copper pillars, and the like, to electrically connect conductive features of packaged semiconductor device 100 with substrate 202, for example. Conductive interconnect traces 212 formed at the surface of the substrate 202 are interconnected to conductive connectors 204 to provide connection to other components, circuits, and features connected to the substrate 202, for example. Portions of conductive traces 212 are shown in a diagonal hatch fill to indicate that these portions may be masked or otherwise prevent solder accumulation during a solder reflow operation, for example. In this embodiment, conductive connectors 204 are connected to I/O circuits of the packaged semiconductor device 100 such as transceiver circuits configured for transmitting and/or receiving RF signals.

Conductive connectors 206 along with conductive bridges 214 are configured and arranged to form an isolation structure 220 to isolate conductive connectors 204 from conductive connectors 208. Conductive pads and interconnecting conductive traces 222 of the isolation structure 220 are formed at the surface of the substrate 202. During a solder reflow operation, for example, solder accumulates on the conductive traces forming the conductive bridges 214. As a result, a solder dam is formed as the isolation structure 220 including conductive connectors 206 and conductive bridges 214. In some embodiments, a solder paste may be stenciled or patterned to facilitate formation of the solder dam. The solder dam serves to isolate conductive connectors 204 from conductive connectors 208 during an underfill operation, for example.

Figure 3:
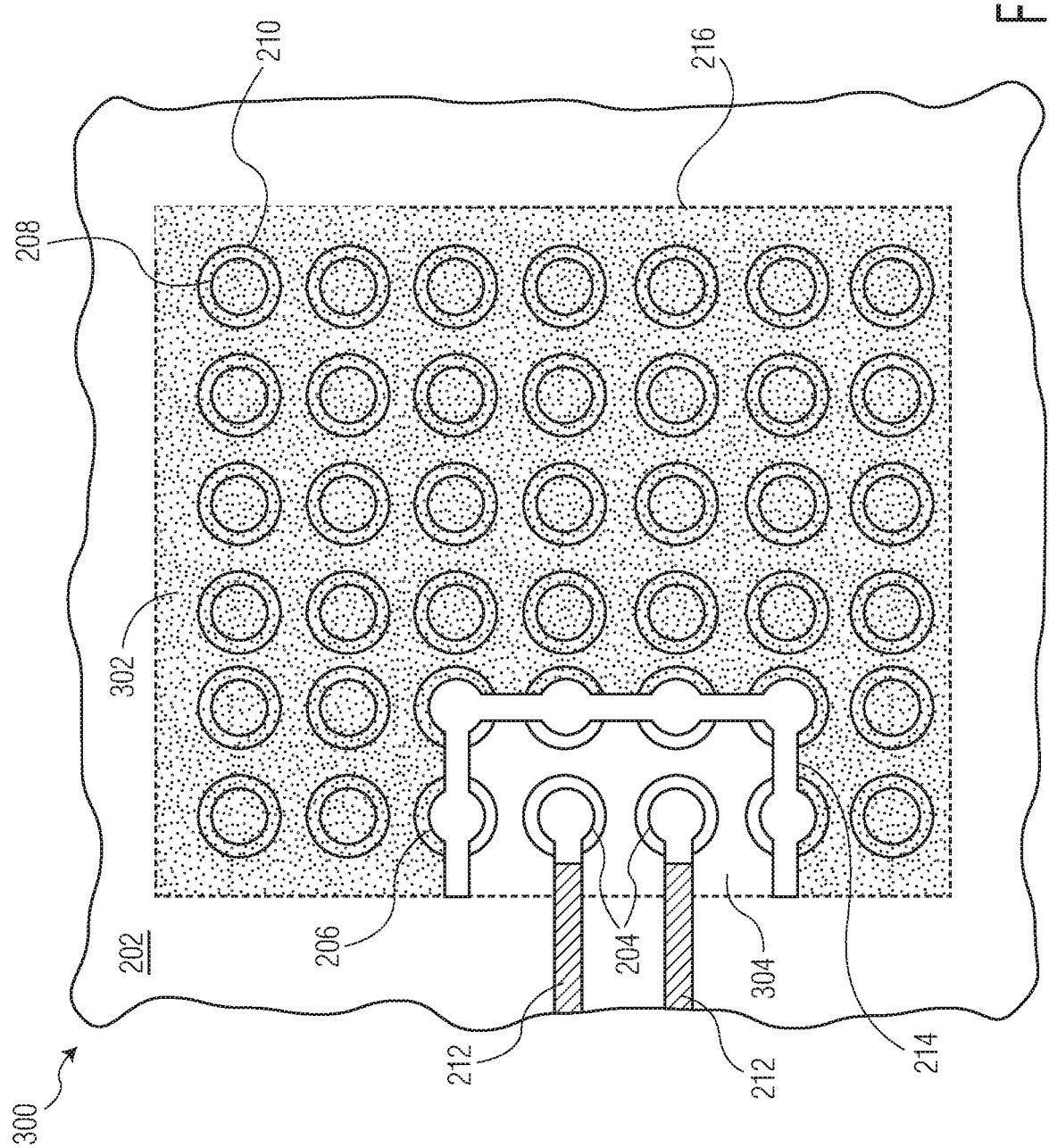
FIG. 3 illustrates, in a plan view, an example underfilled assembly in accordance with an embodiment.

FIG. 3 illustrates, in a plan view, an example underfilled assembly 300 in accordance with an embodiment. In this example, a first region of an air gap formed between the packaged semiconductor device 100 and the substrate 202 is underfilled with an epoxy material 302. In this embodiment, the underfill epoxy material 302 is characterized as a polymer material having a coefficient of thermal expansion (CTE) range compatible with a package and solder CTE range. The dam formed by conductive connectors 206 and conductive bridges 214 serves as a barrier prohibiting the underfill material from reaching a second region 304 of the air gap between the packaged semiconductor device 100 and the substrate 202. Because the second region 304 is essentially void of epoxy material 302, the conductive connectors 204 have significantly less parasitic capacitive coupling allowing for improved performance when transmitting and/or receiving RF signals through the conductive connectors 204, for example. In this embodiment, the dam is connected to a voltage supply terminal (e.g., ground) and further serves as a form of shielding and electrical isolation for the conductive connectors 204.

Figure 4:
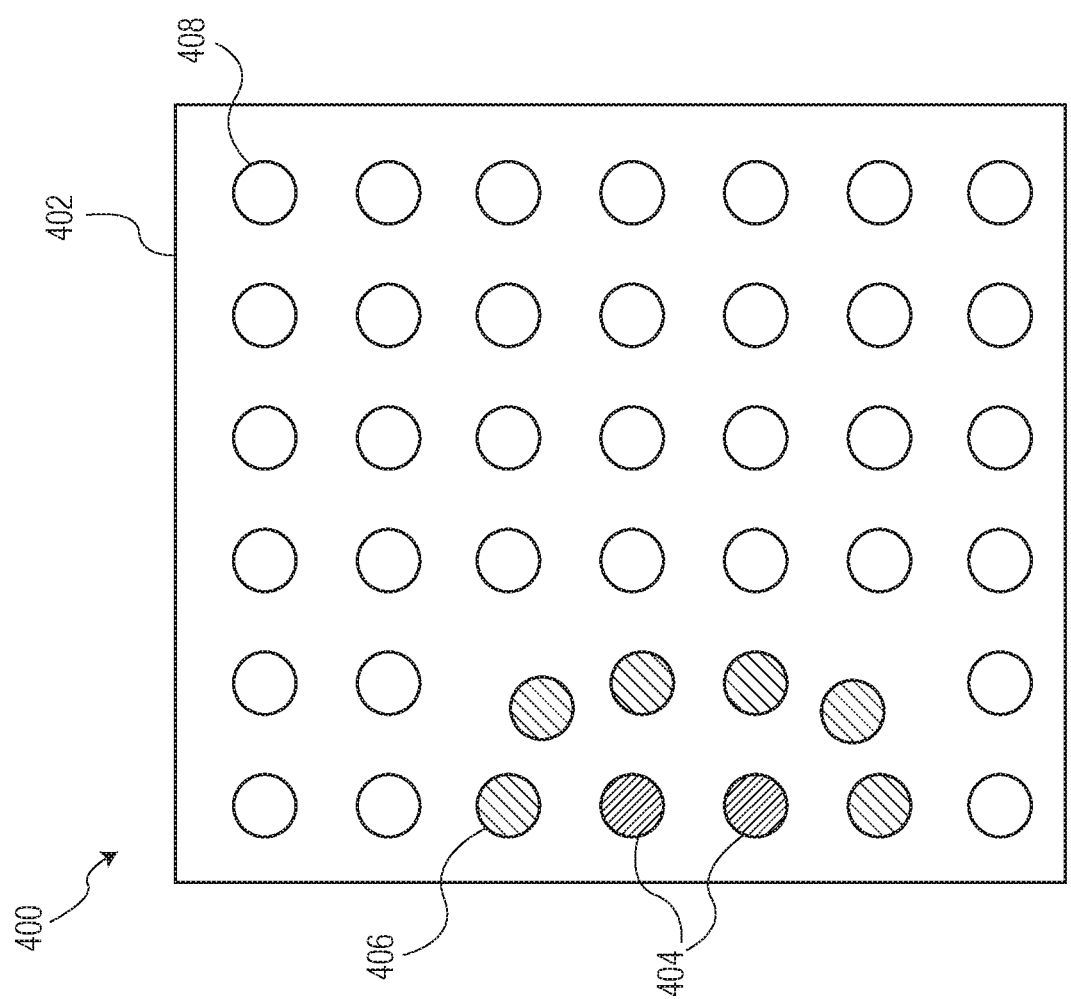
FIG. 4 illustrates, in a plan (through) view, an alternative example packaged semiconductor device having off-matrix pin locations in accordance with an embodiment.

FIG. 4 illustrates, in a plan (through) view, an alternative example packaged semiconductor device 400 having off-matrix pin locations in accordance with an embodiment. In this example, the packaged semiconductor device 400 includes an encapsulant 402 and a plurality of pins 404-408 (e.g., as viewed through the encapsulant 402). Encapsulant 402 may be formed from any suitable epoxy molding compound and the like. Aspects of the packaged semiconductor device 400 such as a semiconductor die, package substrate, and other features are not shown.

Packaged semiconductor device 400 is depicted with a first group of external pins in an orthogonal arrangement (e.g., pins 408) and a second group of external pins in a non-orthogonal or custom arrangement (e.g., pins 406). Here, pins 404-408 are connected to package pads (not shown) for connection to circuitry of the packaged semiconductor device 400. Pins 404-408 may be formed as any suitable conductive connection structure such as solder balls, gold studs, copper pillars, and the like, to electrically connect conductive features of packaged semiconductor device 400 with a substrate or printed circuit board (PCB), for example. In this embodiment, pins 404 are connected to input/output (I/O) circuits such as transceiver circuits configured for transmitting and/or receiving radio frequency (RF) signals. Pins 406 are configured and arranged in a radial arrangement to isolate and shield pins 404 from pins 408 and may be connected to a voltage supply terminal (e.g., ground). In this embodiment, pins 406 are located at a same distance from pins 404 forming the radial arrangement. Pins 408 may be characterized as general-purpose pins such as address, data, clocks, reset, and control signal pins, along with other voltage supply pins.

Figure 5:
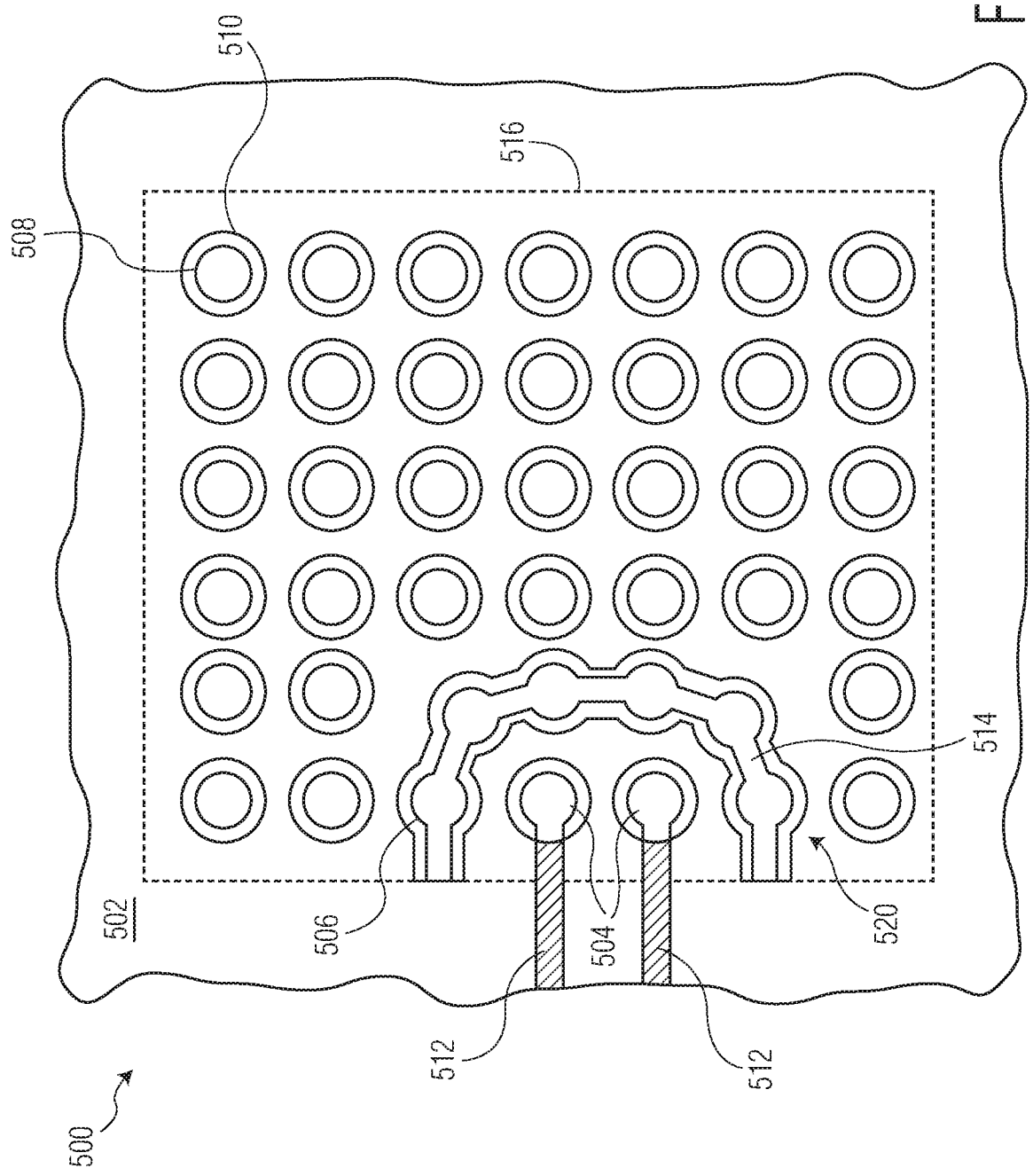
FIG. 5 illustrates, in a plan view, an example assembly having packaged semiconductor device and substrate with off-matrix pad locations in accordance with an embodiment.

FIG. 5 illustrates, in simplified plan view, an example assembly 500 including packaged semiconductor device 400 and substrate 502 having off-matrix pad locations in accordance with an embodiment. In the plan view of the example assembly 500, packaged semiconductor device 400 is depicted in a through view having a perimeter 516 indicated by a dashed line. At this stage of manufacture, packaged semiconductor device 400 is affixed to substrate 502.

Substrate 502 is formed from an insulating material and includes conductive pads 510 formed at the surface of substrate 502. Substrate 502 may be characterized as a printed circuit board (PCB) having one or more layers of conductive interconnecting traces (not shown) separated by non-conductive material (e.g., FR-4). Conductive pads 510 may be formed from suitable conductive materials such as copper, gold, tin, and the like. A plurality of conductive connections are formed between conductive pads 510 and the packaged semiconductor device 400 by way of a plurality of conductive connectors 504-508. Conductive connectors 504-508 (e.g., solder ball pins 404-408 after reflow) are affixed at pads 510 using techniques such as solder reflow and the like. Alternatively, conductive connectors 504-508 may be formed as any suitable conductive structure such as gold studs, copper pillars, and the like, to electrically connect conductive features of packaged semiconductor device 400 with substrate 502, for example. Conductive interconnect traces 512 formed at the surface of the substrate 502 are interconnected to conductive connectors 504 to provide connection to other components, circuits, and features connected to the substrate 502, for example. Portions of conductive traces 512 are shown in a diagonal hatch fill to indicate that these portions are masked during a solder reflow operation, for example, to prevent solder accumulation. In this embodiment, conductive connectors 504 are connected to I/O circuits of the packaged semiconductor device 400 such as transceiver circuits configured for transmitting and/or receiving RF signals.

Conductive connectors 506 along with conductive bridges 514 are configured and arranged to form an isolation structure 520 to isolate conductive connectors 504 from conductive connectors 508. Conductive pads and interconnecting conductive traces of the isolation structure 520 are formed at the surface of the substrate 502. During a solder reflow operation, for example, solder accumulates on the conductive traces forming the conductive bridges 514. As a result, a solder dam is formed as the isolation structure 520 including conductive connectors 506 and conductive bridges 514. In some embodiments, a solder paste may be stenciled or patterned to facilitate formation of the solder dam. The solder dam serves to isolate conductive connectors 504 from conductive connectors 508 during an underfill operation, for example.

Figure 6:
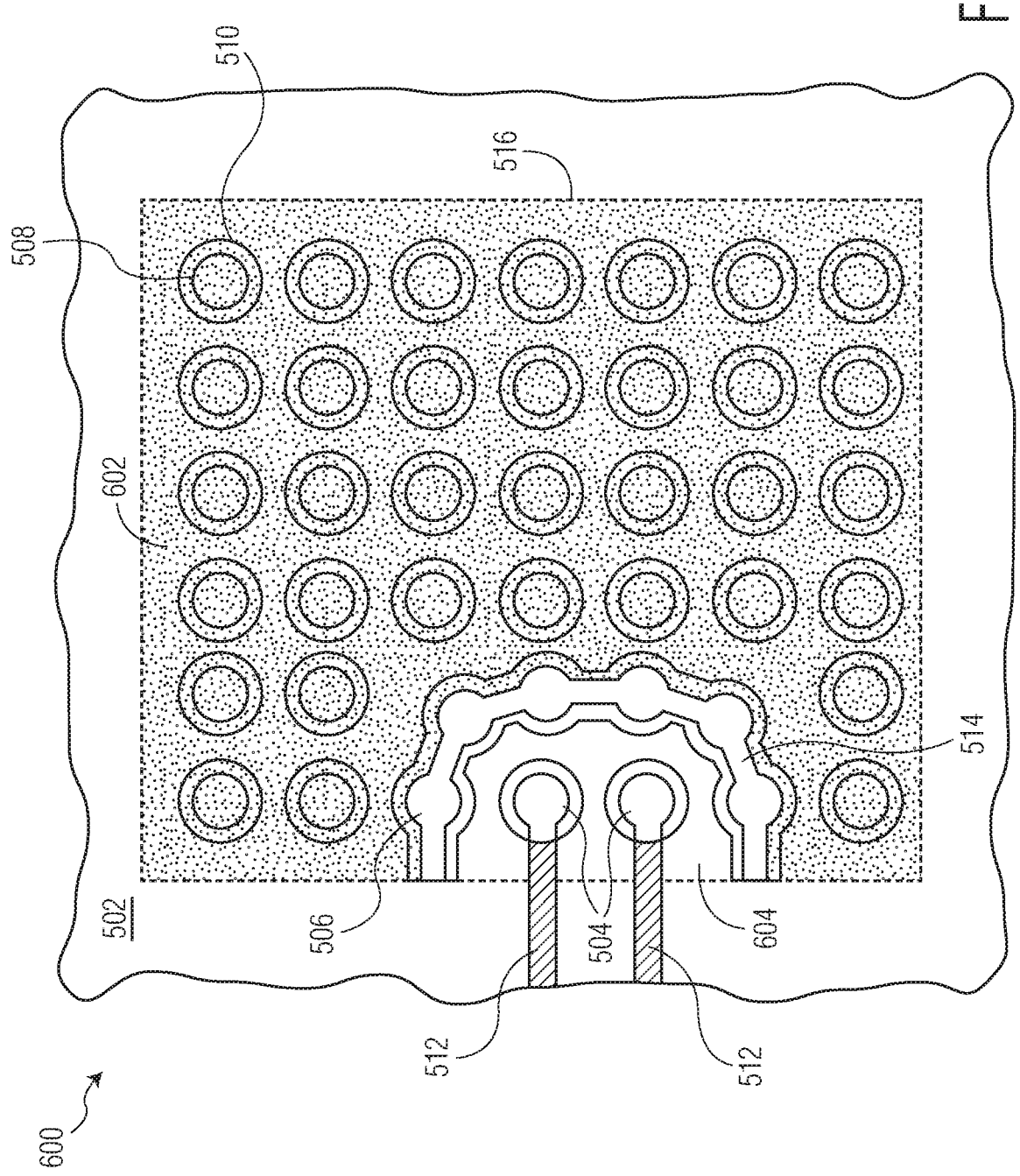
FIG. 6 illustrates, in a plan view, an example underfilled assembly having the off-matrix packaged semiconductor device mounted on the off-matrix substrate in accordance with an embodiment.

FIG. 6 illustrates, in a plan view, an example underfilled assembly 600 having the packaged semiconductor device 400 and substrate 502 in accordance with an embodiment in accordance with an embodiment. In this example, a first region of an air gap formed between the packaged semiconductor device 400 and the substrate 502 is underfilled with an epoxy material 602. In this embodiment, the underfill epoxy material 602 is characterized as a polymer material having a coefficient of thermal expansion (CTE) range compatible with a package and solder CTE range. The dam formed by conductive connectors 506 and conductive bridges 514 serves as a barrier prohibiting the underfill material from reaching a second region 604 of the air gap between the packaged semiconductor device 400 and the substrate 502. Because the second region 604 is essentially void of epoxy material 502, the conductive connectors 504 have significantly less parasitic capacitive coupling allowing for improved performance when transmitting and/or receiving RF signals through the conductive connectors 504, for example. In this embodiment, the dam is connected to a voltage supply terminal (e.g., ground) and further serves as a form of shielding and electrical isolation for the conductive connectors 504.

Figure 7:
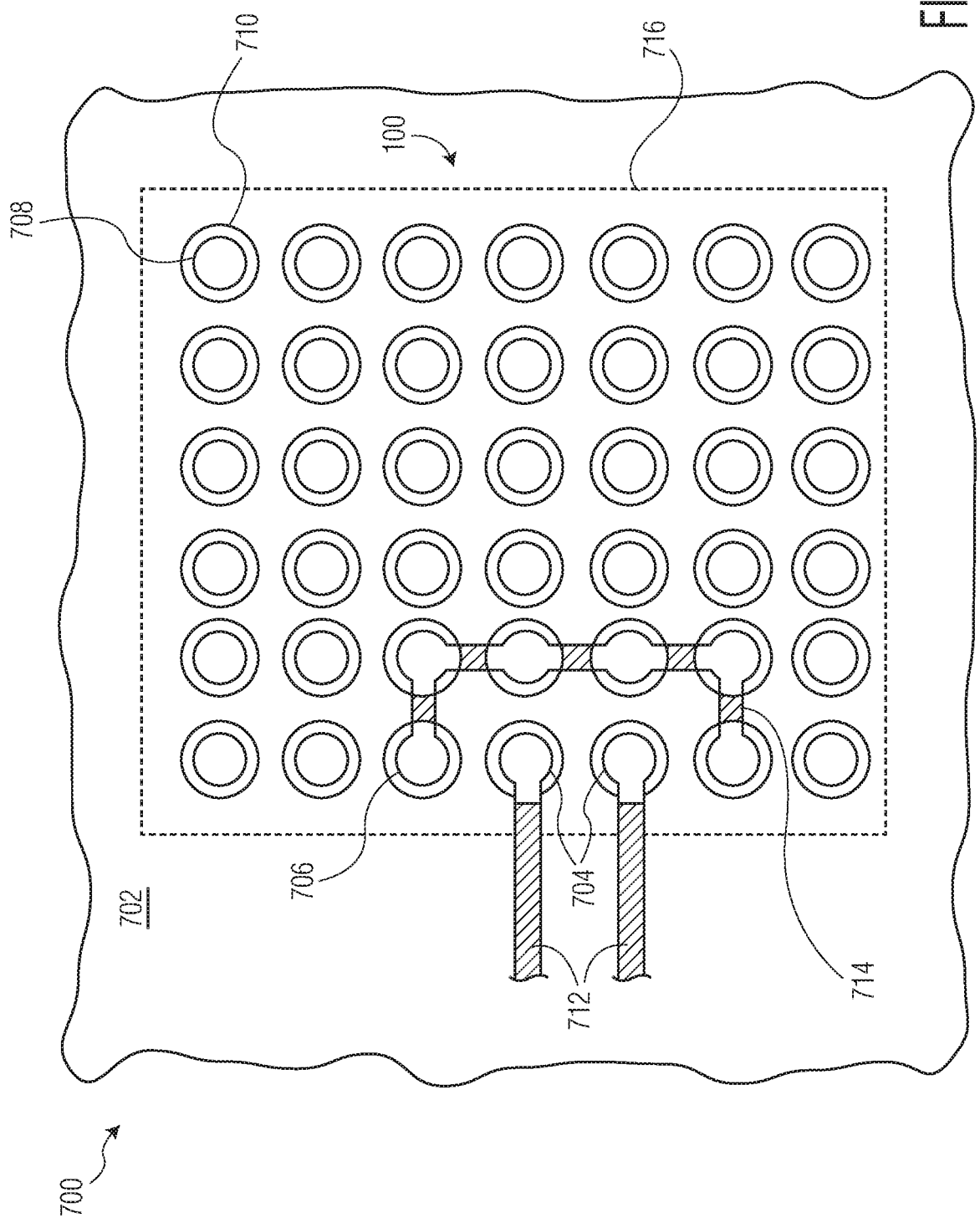
FIG. 7 illustrates, in a plan view, an alternative example assembly including the example packaged semiconductor device 100 (depicted in FIG. 1) and substrate in accordance with an embodiment.

FIG. 7 illustrates, in simplified plan view, an alternative example assembly 700 including the example packaged semiconductor device 100 (depicted in FIG. 1) and substrate 702 in accordance with an embodiment. In the plan view of the example assembly 700, packaged semiconductor device 100 is depicted in a through view having a perimeter 716 indicated by a dashed line. At this stage of manufacture, packaged semiconductor device 100 is affixed to substrate 702.

Substrate 702 is formed from an insulating material and includes conductive pads 710 formed at the surface of substrate 702. Substrate 702 may be characterized as a printed circuit board (PCB) having one or more layers of conductive interconnecting traces (not shown) separated by non-conductive material (e.g., FR-4). Conductive pads 710 may be formed from suitable conductive materials such as copper, gold, tin, and the like. A plurality of conductive connections are formed between conductive pads 710 and the packaged semiconductor device 100 by way of a plurality of conductive connectors 704-708. Conductive connectors 704-708 (e.g., solder ball pins 104-108 of FIG. 1 after reflow) are affixed at pads 710 using techniques such as solder reflow and the like. Alternatively, conductive connectors 704-708 may be formed as any suitable conductive structure such as gold studs, copper pillars, and the like, to electrically connect conductive features of packaged semiconductor device 100 with substrate 702, for example. Conductive interconnect traces 712 formed at the surface of the substrate 702 are interconnected to conductive connectors 704 to provide connection to other components, circuits, and features connected to the substrate 702, for example. Conductive traces 714 formed at the surface of the substrate 702 provide connections between conductive connectors 706. Portions of conductive traces 712 and 714 are shown in a diagonal hatch fill to indicate that these portions are masked during a solder reflow operation, for example, to prevent solder accumulation. In this embodiment, conductive connectors 704 are connected to I/O circuits of the packaged semiconductor device 100 such as transceiver circuits configured for transmitting and/or receiving RF signals.

Figure 8:
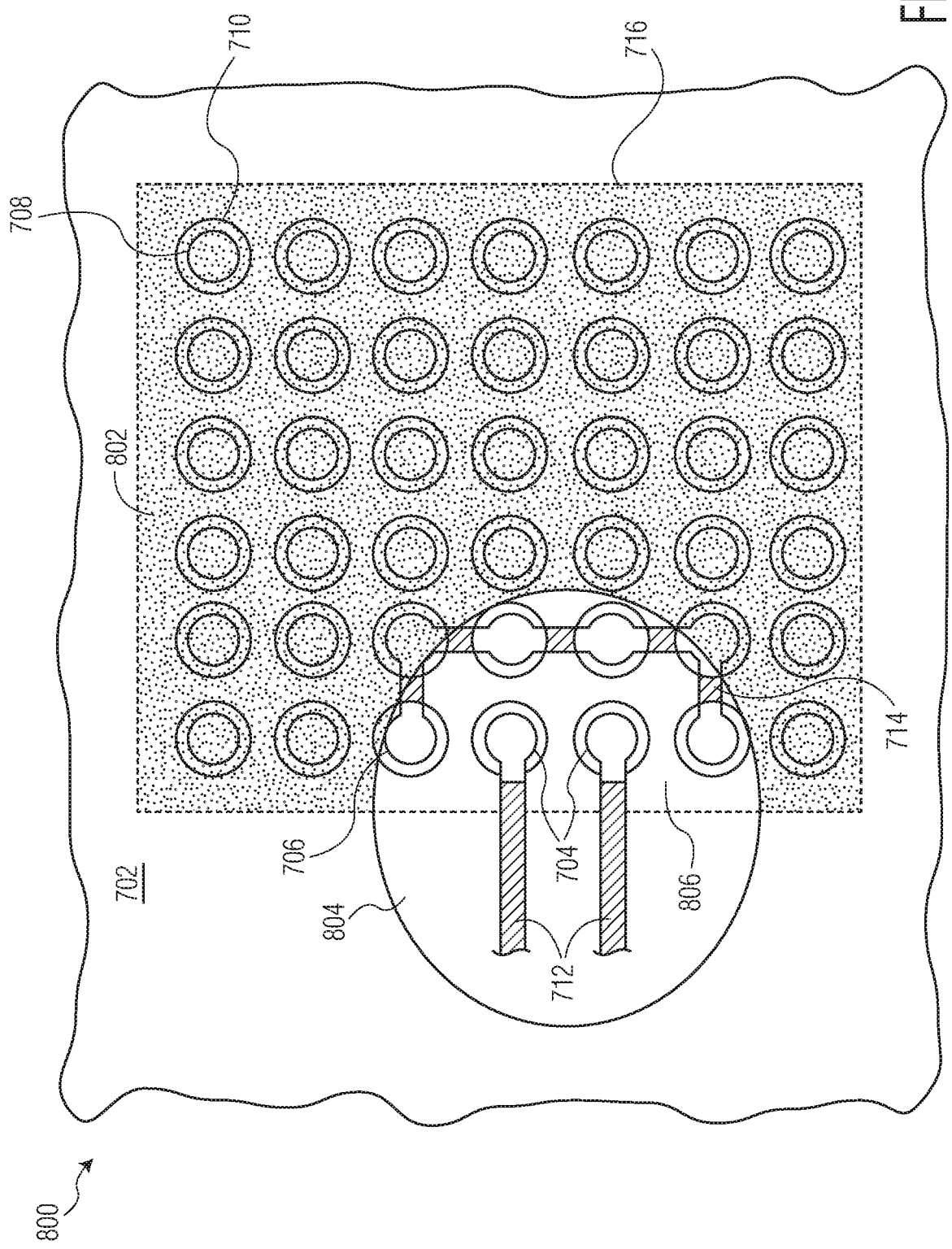
FIG. 8 illustrates, in a plan view, an alternative example underfilled assembly at a stage of manufacture in accordance with an embodiment.

FIG. 8 illustrates, in a plan view, an example underfilled assembly 800 at a stage of manufacture in accordance with an embodiment. In this example, a temporary or sacrificial barrier material 804 (e.g., water soluble compound) is dispensed in a first region 806 of the air gap formed between the packaged semiconductor device 100 and the substrate 702 around conductive connectors 704. In this embodiment, the sacrificial barrier material 804 serves as a temporary dam or isolation structure. After the temporary dam is formed by sacrificial barrier material 804, a second region of the air gap is underfilled with an epoxy material 802. In this embodiment, the underfill epoxy material 802 is characterized as a polymer material having a coefficient of thermal expansion (CTE) range compatible with a package and solder CTE range. The temporary dam formed by sacrificial barrier material 804 serves as a barrier prohibiting the underfill material from underfilling the first region 806.

Figure 9:
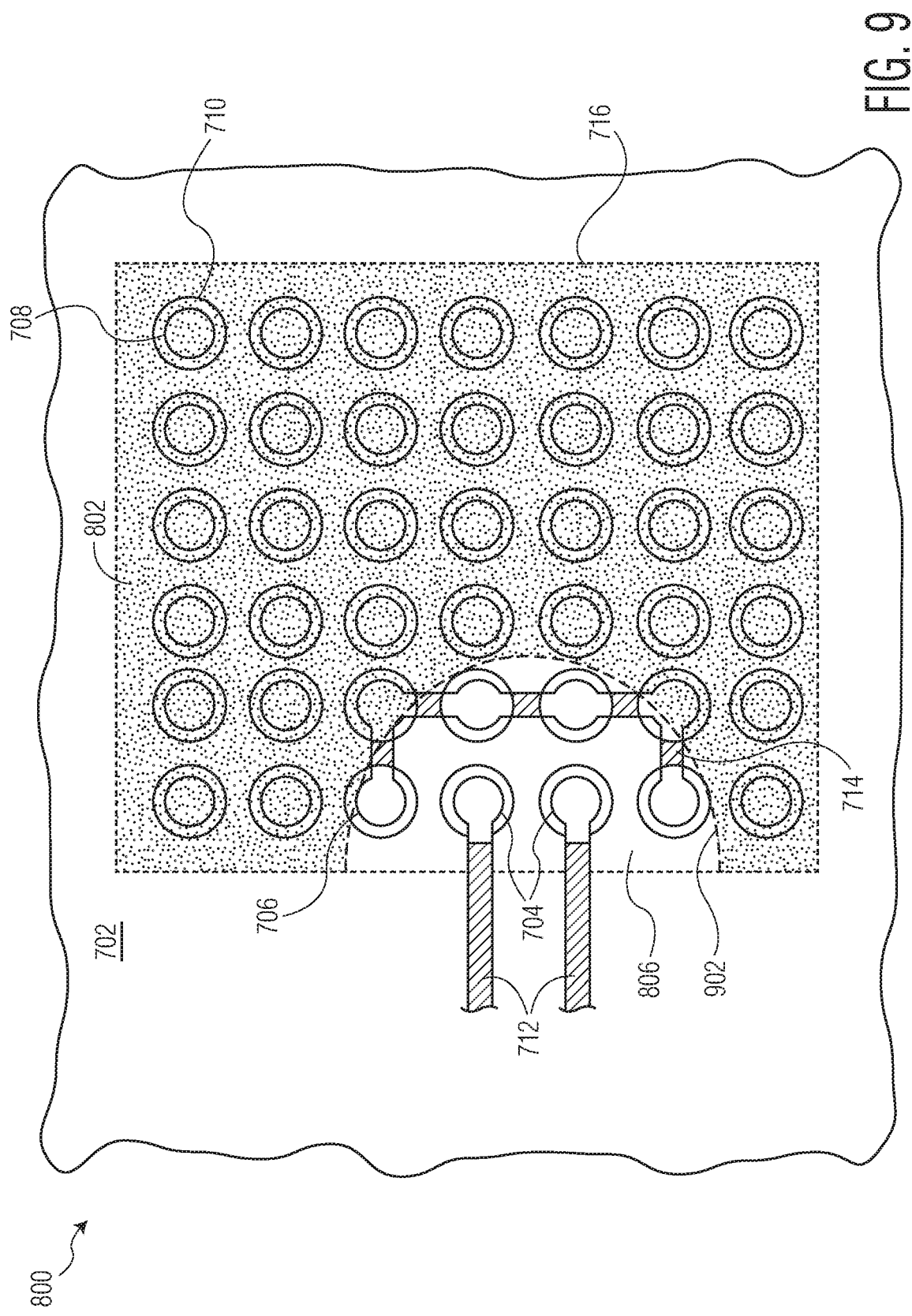
FIG. 9 illustrates, in a plan view, the alternative example underfilled assembly at a subsequent stage of manufacture in accordance with an embodiment.

FIG. 9 illustrates, in a plan view, the example underfilled assembly 800 at a subsequent stage of manufacture in accordance with an embodiment. At his stage, the sacrificial barrier material 804 is removed (e.g., dissolved or etched away) bounding underfill at edge 902 and thus leaving conductive connectors 704 in the first region 806 surrounded by air. Because the first region 806 is essentially void of epoxy material 802, the conductive connectors 704 have significantly less parasitic capacitive coupling allowing for improved performance when transmitting and/or receiving RF signals through the conductive connectors 704, for example. In this embodiment, the conductive connectors 706 are connected to a voltage supply terminal (e.g., ground) and further serves as a form of shielding and electrical isolation for the conductive connectors 704.

Generally, there is provided, a method including attaching a packaged semiconductor device to a substrate; forming an isolation structure located between the packaged semiconductor device and the substrate; and dispensing an underfill material between the packaged semiconductor device and the substrate, the isolation structure preventing the underfill material from contacting a first conductive connection formed between the packaged semiconductor device and the substrate. The substrate may be formed as printed circuit board (PCB) having a plurality of pads configured for a plurality of conductive connections with the packaged semiconductor device in a surface mounted arrangement, the first conductive connection included in the plurality of conductive connections. The conductive connections in the plurality of conductive connections may be orthogonally arranged in rows and columns. The forming the isolation structure may include reflowing a first group of solder balls configured and arranged to prevent the underfill material from contacting the first conductive connection, the first group of solder balls connected to a ground supply terminal at the substrate. The first group of solder balls connected to the ground supply terminal may be further configured and arranged to provide electrical shielding for the first conductive connection. The forming the isolation structure may include depositing a barrier material configured and arranged to prevent the underfill material from reaching a region between the packaged semiconductor device and the substrate, the first conductive connection located within the region. The deposited barrier material may be removed after dispensing the underfill material between the packaged semiconductor device and the substrate. The first conductive connection may be configured for receiving or transmitting a radio frequency (RF) signal. The underfill material may be characterized as a polymer material having a coefficient of thermal expansion (CTE) range compatible with a solder CTE range.

In another embodiment, there is provided, a method including attaching a packaged semiconductor device to a substrate, a plurality of conductive connections formed with the substrate; forming an isolation structure located between the packaged semiconductor device and the substrate, the isolation structure configured and arranged to separate a first region from a second region; and dispensing an underfill material at the first region between the packaged semiconductor device and the substrate, the isolation structure preventing the underfill material from reaching the second region between the packaged semiconductor device and the substrate, at least one conductive connection of the plurality of conductive connections located in the second region. The forming the isolation structure may include reflowing a first group of solder balls configured and arranged to prevent the underfill material from reaching the second region between the packaged semiconductor device and the substrate, the first group of solder balls connected to a ground supply terminal at the substrate. The first group of solder balls connected to the ground supply terminal may be further configured and arranged to provide electrical shielding for the at least one conductive connection. The forming the isolation structure may include depositing a barrier material configured and arranged to prevent the underfill material from reaching the second region between the packaged semiconductor device and the substrate. The deposited barrier material may be removed after dispensing the underfill material at the first region between the packaged semiconductor device and the substrate. The conductive connections in the plurality of conductive connections may be orthogonally arranged in rows and columns. The at least one conductive connection may be configured for receiving or transmitting a radio frequency (RF) signal.

In yet another embodiment, there is provided, an assembly including a substrate having a plurality of conductive pads; a packaged semiconductor device having a plurality of pins, the packaged semiconductor device attached to the substrate such that a plurality of conductive connectors is formed with the plurality of pins and the plurality of conductive pads; an isolation structure disposed between the packaged semiconductor device and the substrate, the isolation structure configured to separate a first region from a second region; and an underfill material disposed in the first region between the packaged semiconductor device and the substrate, the underfill material prevented by way of the isolation structure from reaching the second region between the packaged semiconductor device and the substrate, at least one conductive connector of the plurality of conductive connectors located in the second region. The isolation structure may be formed including a first subset of the plurality of conductive connectors and the at least one conductive connector is included in a second subset of the plurality of conductive connections, the first subset of the plurality of conductive connections connected to a ground supply terminal at the substrate. The substrate may be formed as a printed circuit board (PCB). The at least one conductive connection may be configured for receiving or transmitting a radio frequency (RF) signal.

By now, it should be appreciated that there has been provided a selective underfilled assembly formed with a packaged semiconductor device mounted on a substrate. A group of conductive connectors are configured and arranged to form an isolation structure which separates an underfilled region from a non-underfilled region. The isolation structure serves as a dam or a barrier preventing the under material from reaching the non-underfilled region. Conductive connectors located within the non-underfilled region have reduced parasitic capacitances allowing for improved signal performance.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
    attaching a packaged semiconductor device to a substrate;
    forming an isolation structure located between the packaged semiconductor device and the substrate, the isolation structure configured and arranged to serve as a barrier between an underfill material and a first conductive connection formed between the packaged semiconductor device and the substrate as the underfill material is dispensed; and
    dispensing the underfill material between the packaged semiconductor device and the substrate, the isolation structure preventing the underfill material from contacting the first conductive connection formed between the packaged semiconductor device and the substrate.

2. The method of claim 1, wherein the substrate is formed as printed circuit board (PCB) having a plurality of pads configured for a plurality of conductive connections with the packaged semiconductor device in a surface mounted arrangement, the first conductive connection included in the plurality of conductive connections.

3. The method of claim 2, wherein the conductive connections in the plurality of conductive connections are orthogonally arranged in rows and columns.

4. The method of claim 1, wherein forming the isolation structure comprises reflowing a first group of solder balls configured and arranged to prevent the underfill material from contacting the first conductive connection, the first group of solder balls connected to a ground supply terminal at the substrate.

5. The method of claim 4, wherein the first group of solder balls connected to the ground supply terminal is further configured and arranged to provide electrical shielding for the first conductive connection.

6. The method of claim 1, wherein forming the isolation structure comprises depositing a barrier material configured and arranged to prevent the underfill material from reaching a region between the packaged semiconductor device and the substrate, the first conductive connection located within the region.

7. The method of claim 6, wherein the deposited barrier material is removed after dispensing the underfill material between the packaged semiconductor device and the substrate.

8. The method of claim 1, wherein the first conductive connection is configured for receiving or transmitting a radio frequency (RF) signal.

9. The method of claim 1, wherein the underfill material is characterized as a polymer material having a coefficient of thermal expansion (CTE) range compatible with a solder CTE range.

10. A method comprising:
attaching a packaged semiconductor device to a substrate, a plurality of conductive connections formed with the substrate;
forming an isolation structure located between the packaged semiconductor device and the substrate, the isolation structure configured and arranged to serve as a barrier to separate an underfill material in a first region between the packaged semiconductor device and the substrate from at least one conductive connection of the plurality of conductive connections in a second region between the packaged semiconductor device and the substrate as the underfill material is dispensed; and
dispensing the underfill material at the first region between the packaged semiconductor device and the substrate, the isolation structure preventing the underfill material from reaching the second region between the packaged semiconductor device and the substrate, at least one conductive connection of the plurality of conductive connections located in the second region.

11. The method of claim 10, wherein forming the isolation structure comprises reflowing a first group of solder balls configured and arranged to prevent the underfill material from reaching the second region between the packaged semiconductor device and the substrate, the first group of solder balls connected to a ground supply terminal at the substrate.

12. The method of claim 11, wherein the first group of solder balls connected to the ground supply terminal is further configured and arranged to provide electrical shielding for the at least one conductive connection.

13. The method of claim 10, wherein forming the isolation structure comprises depositing a barrier material configured and arranged to prevent the underfill material from reaching the second region between the packaged semiconductor device and the substrate.

14. The method of claim 13, wherein the deposited barrier material is removed after dispensing the underfill material at the first region between the packaged semiconductor device and the substrate.

15. The method of claim 10, wherein the conductive connections in the plurality of conductive connections are orthogonally arranged in rows and columns.

16. The method of claim 10, wherein the at least one conductive connection is configured for receiving or transmitting a radio frequency (RF) signal.

* * * * *